United States Patent [19]
Bruccoleri et al.

[11] Patent Number: 5,914,642
[45] Date of Patent: *Jun. 22, 1999

[54] TEMPERATURE INDEPENDENT CURRENT CONTROLLED MULTIVIBRATOR

[75] Inventors: Melchiorre Bruccoleri, Genoa; Gaetano Cosentino, Catania; Marco Demicheli, Como; Valerio Pisati, Pavia, all of Italy

[73] Assignees: SGS-Thomson Microelectronics S.r.l., Agrate Brianza; Consorzio per la Ricerca sulla Microelettronica nel Mezzogiorno, Catania, both of Italy

[*] Notice: This patent issued on a continued prosecution application filed under 37 CFR 1.53(d), and is subject to the twenty year patent term provisions of 35 U.S.C. 154(a)(2).

[21] Appl. No.: 08/777,472

[22] Filed: Dec. 30, 1996

Related U.S. Application Data

[60] Provisional application No. 60/016,614, May 1, 1996.

[51] Int. Cl.⁶ .................................................. H03K 3/283
[52] U.S. Cl. ........................................ 331/113 R; 331/144
[58] Field of Search ................................. 331/113 R, 144

[56] References Cited

U.S. PATENT DOCUMENTS

| | | | |
|---|---|---|---|
| 3,665,343 | 5/1972 | Thompson | 331/113 R |
| 4,543,665 | 9/1985 | Sotelo et al. | 455/606 |
| 4,884,042 | 11/1989 | Menon et al. | 331/113 R |
| 5,367,270 | 11/1994 | Lorenz | 331/113 R |
| 5,604,466 | 2/1997 | Dreps et al. | 331/113 R |

FOREIGN PATENT DOCUMENTS

| | | |
|---|---|---|
| A-5 2-014340 | 2/1977 | Japan . |
| A-03 060514 | 3/1991 | Japan . |

*Primary Examiner*—Siegfried H. Grimm
*Attorney, Agent, or Firm*—Wolf, Greenfield & Sacks, P.C.

[57] ABSTRACT

A current-controlled multivibrator having increased accuracy independent of variations in process and temperature. The oscillator employs a bandgap voltage in combination with a current generator to ensure operational stability despite temperature and process variations.

7 Claims, 5 Drawing Sheets

(PRIOR ART)

TEMPERATURE INDEPENDENT CURRENT CONTROLLED MULTIVIBRATOR

CROSS-REFERENCE TO RELATED APPLICATION

This application claims priority from Provisional 60/016,614, filed May 1, 1996 which is hereby incorporated by reference.

BACKGROUND AND SUMMARY OF THE INVENTION

Figure 1:
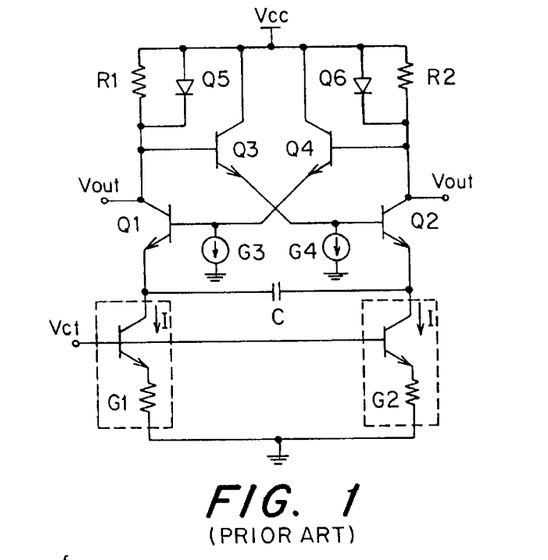
FIG. 1 shows the circuit diagram of a known oscillator.

FIG. 1 shows the circuit diagram of a known oscillator. Similar oscillators are described, for example, from page 695 to page 698 of *Analog Integrated Circuits*, P. R. Gray and R. G. Meyer, published by Wiley, third edition, 1993, which is hereby incorporated by reference. This type of oscillator can be produced in an integrated circuit, and its frequency can be controlled by varying a voltage at one of its control terminals.

The circuit of FIG. 1 is formed by two branches, each of which comprises an NPN transistor Q1 and Q2. The collectors of the transistors Q1 and Q2 are connected to a first supply terminal Vcc through a respective resistor R1, R2 and the emitters thereof are connected to a second supply terminal, indicated by the ground symbol, through respective controllable current generators G1 and G2. The generators G1 and G2 are formed by two NPN transistors, the emitters of which are connected to ground through respective resistors and the bases of which are together connected to a voltage control terminal Vct. The emitters of the transistors Q1 and Q2 are coupled to one another by means of a capacitor C and the collectors thereof are each coupled to the base of the other by means of a respective NPN transistor Q3 and Q4. More precisely, the collectors of the transistors Q3 and Q4 are connected to the terminal Vcc, and the bases thereof are connected to the collectors of Q1 and Q2, respectively, and the emitters thereof are connected to the bases of Q2 and Q1, respectively, and also to the ground terminal through a constant current generator G4 and G3, respectively. A diode Q5, Q6 biased in the direction of conduction is connected in parallel with respective resistor R1, R2.

As is known, the circuit described operates as a free-running multivibrator in which the two transistors pass alternately from the conductive state to the non-conductive state as a result of the positive reaction between them, at a frequency determined by the capacity of the capacitor C and by the current of the generators G1 and G2. If the circuit is symmetrical and if the current of the generators G1 and G2 is large enough to bring about sufficient voltage drops in the resistors R1 and R2 to exceed the threshold voltage of the associated diodes Q5 and Q6, in the collectors of the transistors Q1 and Q2, that is to say, in the circuit terminals, voltage signals will be produced which are formed by complementary square waves of frequency $$f = I/4C\, V_{BE(on)} \tag{1}$$

where I is the current of the generators G1 and G2, C is the capacitance of the capacitor indicated with the same symbol in FIG. 1 and $V_{BE(on)}$ is the voltage drop at a forward biased junction (it is assumed, to the first approximation, that the voltage drops at the base-emitter junctions of the transistors and at the junctions of the diodes are all equal).

Figure 4:
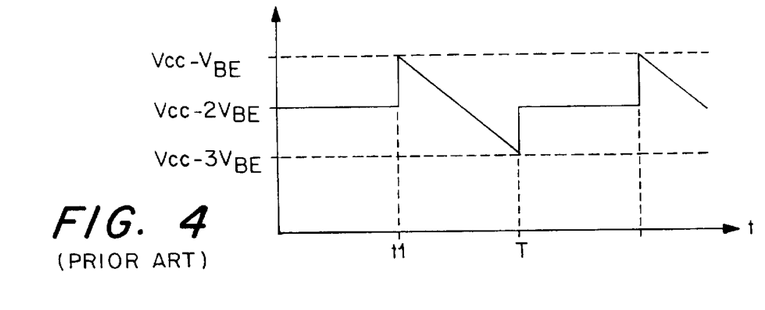
FIG. 4 is a graph showing the variation in the voltage over time on a point of the circuit of FIG. 1.

The circuit lends itself to being used as an oscillator of which the frequency can be controlled by regulating the current of the current generators G1 and G2, in this case by applying a suitable control voltage to the terminal Vct. The voltage variations at the emitter of Q2 are shown in the graph of FIG. 4.

The frequency of the oscillator is directly proportional to the current I in accordance with the relationship shown in equation (1) above provided that, as was indicated above, the current is sufficiently large to permit forward conduction through the diodes Q5 and Q6. If it is not, the frequency depends on the voltage drop across the resistors R1 and R2 and its dependence on the current I becomes inversely proportional. There is thus a non-monotonic characteristic of the frequency as a function of the current, as shown by the curve shown in FIG. 3. The minimum frequency of the oscillator is therefore determined by the value of the current at which the inversion of the gradient of the characteristic takes place. The above-described behavior must absolutely be avoided if the oscillator is to be used in a phase-locked loop (PLL), because the lack of monotonicity could give rise to a positive feedback during the locking transient. The oscillator can therefore be used in this case provided that the current is prevented from falling below a predetermined value.

Figure 5:
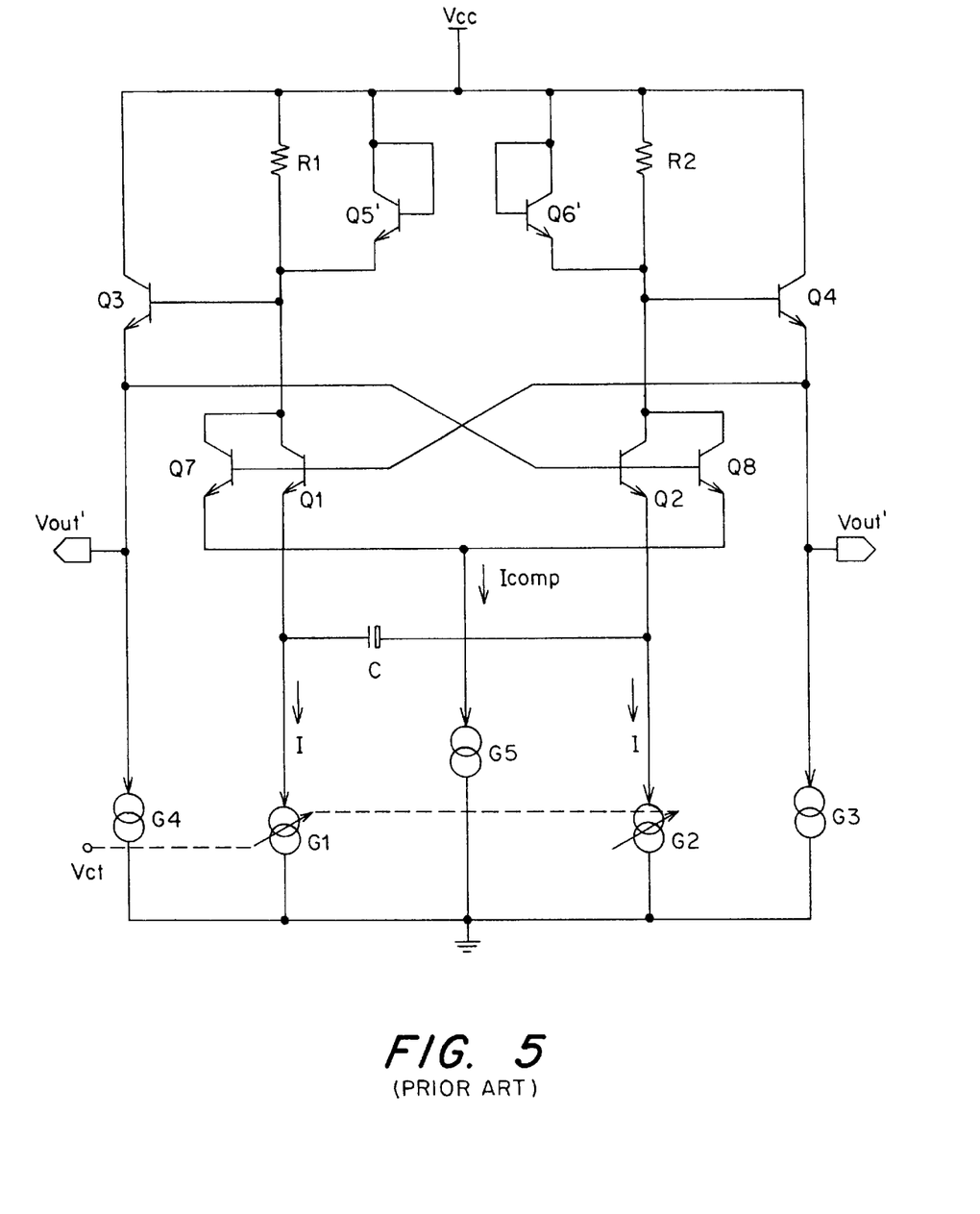
FIG. 5 shows the circuit diagram of a third known oscillator.

Next consider the circuit of FIG. 5, including the generating group Q7, Q8 and GS. In the circuit of FIG. 5, components that are the same as those of the circuit of FIG. 1 are indicated by the same reference symbol. This circuit differs from that of FIG. 1 basically by the fact that it comprises current generating means associated with the two transistors Q1 and Q2. It also has non-substantial differences owing to the fact that, in parallel with the resistors R1 and R2, instead of the diodes Q5 and Q6, there are two npn transistors Q5' and Q6' which are connected as diodes and are biased in the direction of conduction and owing to the fact that its outputs, marked Vout', are on the bases, instead of on the collectors, of Q1 and Q2. The current generating means associated with the transistors Q1 and Q2 are formed by a constant current generator G5 and by two npn transistors Q7 and Q8 of which the emitters are together connected to ground through the generator G5 and the base and collector terminals are connected, repsectively, to the base and collector terminals of the associated transistors Q1 and Q2.

Consider the operation of the oscillator of FIG. 5.

It will be assumed that Q1 is conductive and that Q2 is non-conductive. The transistor Q5' is conductive if the following condition for the base and emitter voltages $V_{BQ5'}$ and $V_{EQ5'}$, respectively, is satisfied:

$$V_{BQ5'} - V_{EQ5'} \geq V_{BE(on)Q5'} \tag{5}$$

where $V_{BE(on)Q5'}$ is the voltage across the forward-biased base-to-emitter junction of Q5', its base voltage is:

$V_{BQ5'} = Vcc$ and its emitter is:

$V_{EQ5'} = Vcc - IR$ wherein I is the current of the generator G1 and R is the resistance of the resistor R1.

By substituting into (5) there is obtained $IR > V_{BE(on)Q5'}$ which is the condition for Q5' to conduct.

Figure 3:
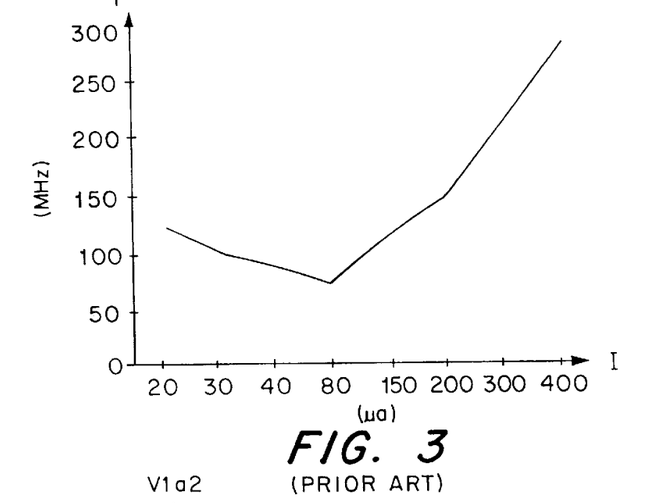
FIG. 3 is a graph showing the frequency-current characteristics of a known oscillator, e.g. the oscillator of FIG. 1.

In the oscillator of FIG. 1, for values of the current I that are too low, so that the drop in R1 is less than $V_{BE(on)Q5'}$, the frequency of the oscillator is inversely proportional to the current, as is shown by FIG. 3.

The transistors Q7 and Q8 (compensation transistors) are brought into conduction or non-conduction simultaneously with the transistors Q1 and Q2 with which they are associated; they therefore inject the current Icomp of the generator G5 alternately into one or other resistor R1 or R2 when the respective transitor Q1 and Q2 is conductive. The current Icomp is selected in such a manner that the voltage drop across one or other resistor R1, R2, due to the sum of the current I of one or other generator G1, G2 and the current Icomp, is at least equal to the voltage $V_{BE(on)Q5'}$. The frequency of the oscillator is thus not governed by the voltage drop in R1 or R2 and can be regulated to very low values by establishing correspondingly low control currents. In addition, the frequency-current characteristic is monotonic, as illustrated by FIG. 6, and the oscillator can therefore be used in PLL loops without limiting the synthesizable frequencies and without any risk of positive feedback during the locking transients.

It is of course also necessary for the current Icomp not to be so high as to maintain the transistors, connected as diodes Q5' and Q6', in the conductive state even without the contribution of the currents I of the generators G1 and G2, otherwise the circuit would not be able to oscillate.

Figure 6:
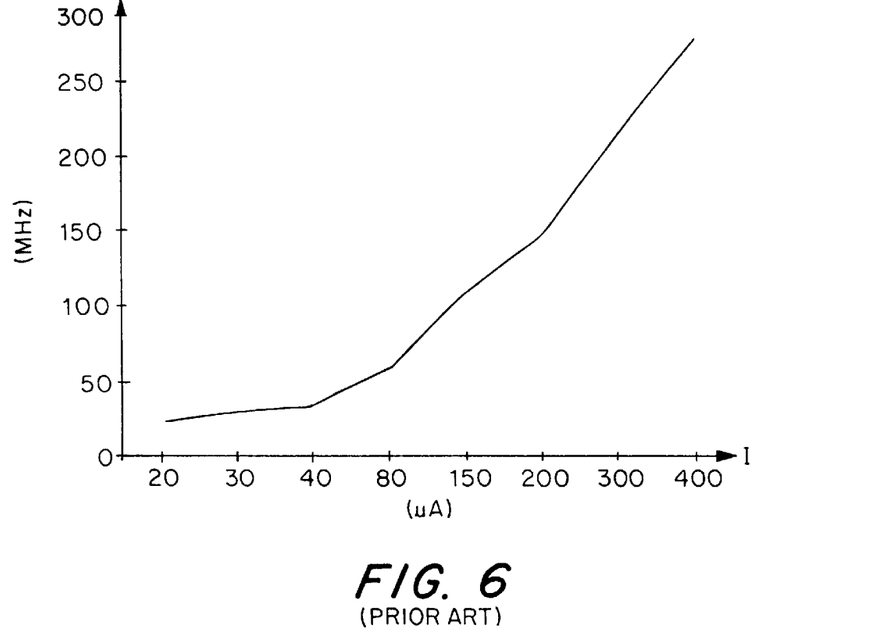
FIG. 6 is a graph showing the frequency-current characteristics of the oscillator of FIG. 5.

By way of example, the most important parameters of an oscillator produced in practice, having the charactersitic of FIG. 6, were the following: Vcc=5 V, R=Ohm, C=1 pF, Icomp=100 μA.

Figure 2:
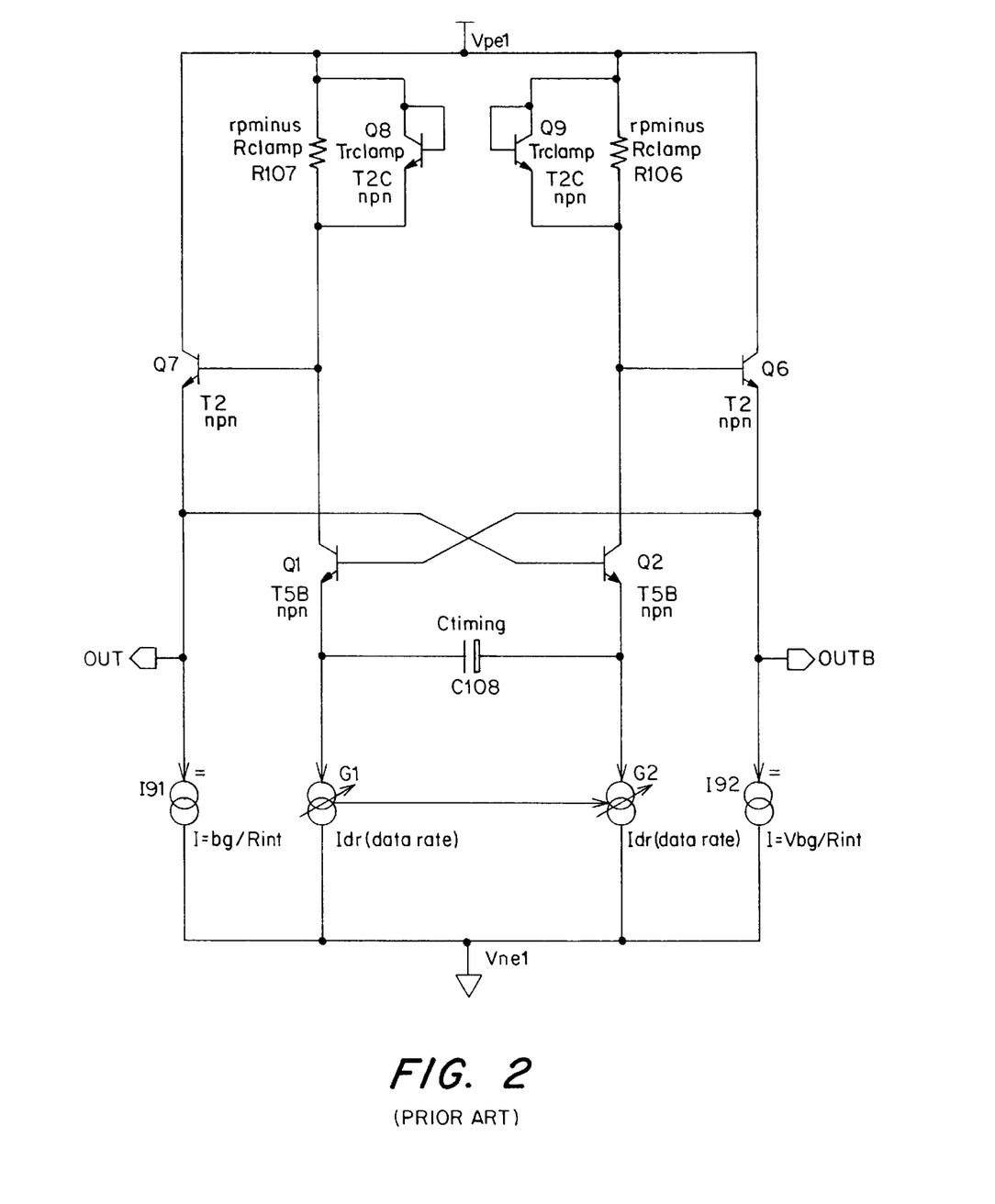
FIG. 2 shows the circuit diagram of a second known oscillator.

FIG. 2 shows another known oscillator embodiment, which differs slightly from the circuit of FIG. 1. Note that the output of the circuit of FIG. 2 is dependent on the value of Vbe, i.e. the voltage drop at a forward-biased junction, which may vary according to changes in process or temperature. Such variance is, of course, undesirable.

The frequency of the oscillator of FIG. 2 is determined by the value of Vbe and the value of the current Idr (I data rate):
$f=Idr/(4*V_{be}*Ctiming)$
Therefore, the oscillator frequency will vary according to changes in Vbe, which may be caused by changes in temperature and process.

Therefore there is disclosed an innovative circuit for an oscillator which remains accurate independent of changes in process or temperature.

BRIEF DESCRIPTION OF THE DRAWINGS

The disclosed invention will be described with reference to the accompanying drawing wherein.

DETAILED DESCRIPTION OF THE PREFERRED EMBODIMENT

Figure 7:
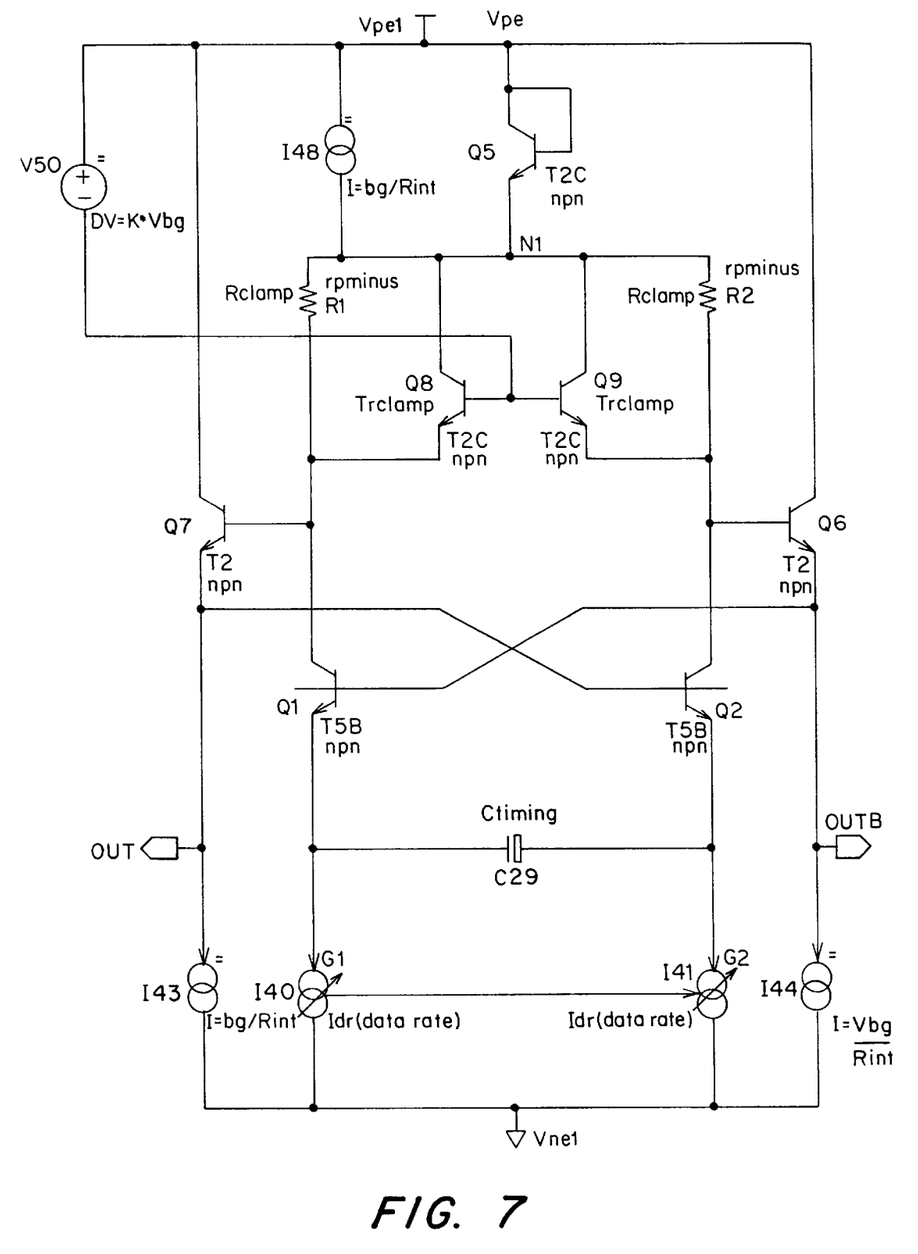
FIG. 7 shows the circuit diagram of an oscillator according to the preferred embodiment of the invention.

The numerous innovative teachings of the present application will be described with particular reference to the presently preferred embodiment (by way of example, and not of limitation), in which:

The innovative oscillator of the presently preferred embodiment as shown in FIG. 7 will be considered. The quantity controlling the frequency of the oscillator reported in the example is a current (Idr), but it can also be a voltage, if a suitable input voltage/current convert stage is inserted.

FIG. 7 differs from FIG. 2 in several ways. First, transistor Q5 is diode connected in parallel with a current generator 148 between voltage Vpe and node N1. The voltage at Node N1 will therefore be one threshold lower than Vpe. Second, in FIG. 2, transistors Q8 and Q9 are diode connected in parallel with resistors Rclamp between voltage Vpe and the respective base of transistors Q7 and Q6. In FIG. 7, like FIG. 2, transistors Q8 and Q9 are connected in parallel with resistors Rclamp. However, in FIG. 7, transistors Q8 and Q9 are not diode connected, but rather have their bases connected to the output of voltage generator V50. Additionally, in FIG. 7, resistors Rclamp and transistors Q8 and Q9 are connected to Node N1, which has a voltage level one threshold lower than Vpe. These differences enable the circuit shown in FIG. 7 to operate independently of process or temperature variations as will be discussed in more detail below.

The frequency of the oscillator is determined by the value of the voltage DV of a band-gap referenced voltage source V50, of the kind described on pages 338–346 of the volume cited at the beginning of this description and by the value of the current Idr (I data rate) in accordance to the following relationship:

$f=Idr/(4*Dv*Ctiming)$ $f$ therefore has an accuracy better than the one of the known circuits as shown in FIGS. 1 and 2 and described above, since DV, as a bandgap referenced voltage, is insensitive to the changes of Vbe, i.e. the voltage drop at a forward-biased junction, which can be due to spread of process and/or temperature.

The following is a detailed description of the operation of the presently preferred embodiment of FIG. 7.

It will be assumed that the transistor Q2 is in a direct conductive state (ON); the voltage VeQ2 at the emitter of Q2 is:

$$VeQ2=Vpe-VbeQ5-VbeQ7-VbeQ2 \quad (1)$$

where Vpe is the voltage of a power supply and VbeOn is the voltage drop at the forward-biased base-emitter junction of transistor On On the base of Q1 there is a voltage VbQ1 equal to:

$$VbQ1=Vpe-DV-VbeQ9-VbeQ6 \quad (2)$$

and on the emitter of Q1 there is a voltage equal to:

$$VeQ1=VeQ2-DVc=(Vpe-VbeQ5-VbeQ7-VbeQ2)-DVc, \quad (3)$$

where DVc is the voltage across capacitor Ctiming and the expression (1) has been used.

The switching condition of Q1 and Q2 is reached when:

$$VbQ1-VeQ1=VbeQ1on \quad (4)$$

By replacing in (4) the values from the expressions (2) and (3) we have:

$$(Vpe-DV-VbeQ9-VbeQ6)-(Vpe-VbeQ5-VbeQ7-VbeQ2-DVc)=VbeQ1on$$

By reducing Vpe and by suitably collecting the different terms it follows:

$$(-DV+DVc)+(VbeQ7-VbeQ6)+(VbeQ5-VbeQ9)+(VbeQ2-VbeQ1on)=0 \quad (6)$$

VbeQ7 is equal to VbeQ6, owing to the fact that the same current flows through the two transistors.

In order to make VbeQ5 equal to VbeQ9 the collector currents of the clamp transistors (Trclamp) need to be alternatively equal to the one through Q5. This is obtained by supplying to each of the clamp resistors (Rclamp), when the related clamp transistor is on, the following current:

$$I\_Rclamp=Dv/Rclamp$$

through a generator I48 of a constant current DV/RClamp.

Owing to the introduction of I48, the current through Q5 is 2*Idr−I_Rclamp, equal to the one through Q9, therefore rendering VbeQ5 and VbeQ9 equal.

Without I48, the current through Q5 would be 2*Idr, whilst through Q9 we have 2*Idr−I_Rclamp. In this case VbeQ5 would be different from VbeQ9 (because the currents through Q5 and Q9 are different) and the difference VbeQ5−VbeQ9 is not zero.

Therefore the relationship (6) can be written:

$$(-DV+DVc)+(VbeQ2-VbeQ1on)=0$$

At the switching moment VbeQ2=VbeQ1on, and then:

$$-DV+DVc=0, \text{ or } DV=DVc$$

At this point the transistor Q1 is brought into conduction, while Q2 is brought into non-conduction; the base voltage of Q2 is now:

$$VbQ2=Vpe-DV-VbeQ8-VbeQ7$$

The emitter of Q2 is now a point of high impedance:

$$VeQ2=VeQ1+DVc(t=T1)=VeQ1+DV=Vpe-VbeQ5-VbeQ6-VbeQ1+DV$$

Figure 8:
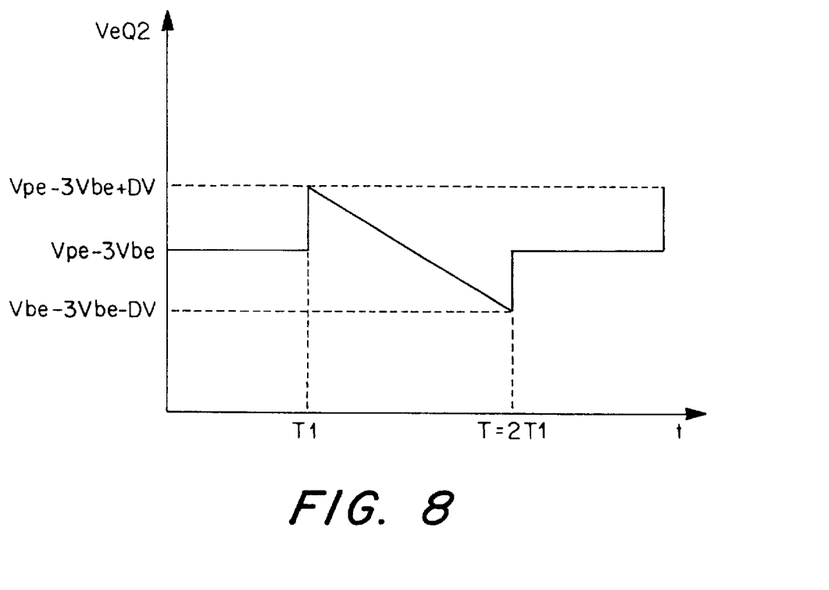
FIG. 8 is a graph showing the variation in the voltage over time on a point of the circuit of FIG. 7.

Since the condition of oscillation is Th=Q/Idr (the half period Th is given by the time required to charge the capacitor) and Q=Ctiming*DVc, or DVc/Th=Idr/Ctiming, from the graph of FIG. 8 (for the sake of notation simplicity the Vbes have been added together) we obtain the condition of oscillation: DVc/(2T1−T1)=Idr/Ctiming, or $$((Vpe-3Vbe+DV)-(Vpe-3Vbe-DV))/(2T1-T1)=Idr/Ctiming,$$

which can be written:

2DV/T1=Idr/Ctiming or T1=2Ctiming*DV/Idr or, substituting T1 with the half period T/2, T/2=2Ctiming*DV/Idr, from which:

T=4Ctiming*DV/Idr. Thus, the frequency ƒ=1/T is ƒ=Idr/(4Ctiming*DV)

Therefore, the innovative circuit of the preferred embodiment avoids the condition of oscillation being governed by Vbe changes, owing to the fact that now the frequency is dependent on the value of DV and not on Vbe and we have a perfect matching of the Vbes by current generator I48.

The operation of the innovative oscillator of FIG. 7 improves on that of the circuits of FIGS. 1 and 2.

According to one disclosed class of innovative embodiments, there is provided a multivibrator circuit, comprising: first and second transistors, connected to each other in a positive feedback relationship; a variable current source, connected between respective first current-carrying terminals of said first and second transistors and a first reference voltage; a capacitor connected between said first current-carrying terminals of said first and second transistors; a current generator circuit connected between a second reference voltage and respective second current carrying terminals of said first and second transistors; and a bandgap-referenced voltage source connected to regulate said current generator circuit; wherein said variable current source controls the oscillating frequency of said multivibrator circuit.

According to another disclosed class of innovative embodiments, there is provided a multivibrator circuit, comprising: first and second NPN transistors, connected to each other in a positive feedback relationship; a variable current source, connected between respective emitters of said first and second transistors and a first reference voltage; a capacitor connected between said emitters of said first and second transistors; a current generator circuit connected between a second reference voltage and respective collectors of said first and second transistors; and a bandgap-referenced voltage source connected to regulate said current generator circuit; wherein said variable current source controls the oscillating frequency of said multivibrator circuit.

According to another disclosed class of innovative embodiments, there is provided a method for producing an oscillating signal with a variable frequency, comprising the steps of: receiving a control signal; generating a variable current according to said control signal; driving first and second transistors with said variable current, connecting the control terminal of each of said first and second transistors to be controlled by the current passing through the other of said first and second transistors; providing a timing capacitor connected between the emitters of said first and second transistors; providing a bandgap-referenced voltage source; generating a reference current from said voltage source; passing said reference current to said first and second transistors; and connecting the said first and second transistors to an output.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A multivibrator circuit, comprising:
    first and second bipolar transistors, connected to each other in a positive feedback relationship;
    a capacitor connected between emitters of said first and second transistors;
    a variable current source connected between respective emitters of said first and second transistors and a first terminal of a voltage supply source for controlling the oscillating frequency of said multivibrator circuit;
    first and second resistors having a same resistance connected between respective collectors of said first and second transistors and, a second terminal of said voltage supply;
    a bandgap-referenced voltage source;
    a pair of clamping transistors each having an emitter-collector path connected in parallel with a respective one of said first and second resistors and a base connected to said bandgap-referenced voltage source; and
    a current generator connected to said first and second resistors to supply said first and second resistors with a constant current substantially equal to a ratio between a voltage of said bandgap-referenced voltage source and said resistance.

2. The circuit of claim 1, wherein said circuit is insensitive to changes in process or temperature.

3. The circuit of claim 1, wherein said positive feedback relationship between said first and second transistors also includes two additional transistors, each interposed between a current-carrying terminal of said one of said first and second transistors and a control terminal of the other of said first and second transistors.

4. The circuit of claim 1, wherein said variable current source is comprised of a transistor and a series resistor.

5. The circuit of claim 3, wherein said additional transistors are each biased by a second respective current generator.

6. The circuit of claim 3, wherein a current source is connected to provide a bias to at least one of said additional transistors.

7. The circuit of claim 1, wherein said clamping transistors are each NPN bipolar transistors.

* * * * *

UNITED STATES PATENT AND TRADEMARK OFFICE
CERTIFICATE OF CORRECTION

PATENT NO. : 5,914,642

DATED : June 22, 1999

INVENTOR(S): Melchiorre Bruccoleri, Gaetano Consentino, Marco Demicheli and Valerio Pisati It is certified that error appears in the above-identified patent and that said Letters Patent is hereby corrected as shown below:

Col. 2, line 60, should read:

$$IR \geq V_{BE(on)Q5'}$$

Signed and Sealed this

Sixteenth Day of November, 1999

Attest:

Q. TODD DICKINSON

*Attesting Officer*  *Acting Commissioner of Patents and Trademarks*